US009524850B2

(12) United States Patent
Zandbergen et al.

(10) Patent No.: US 9,524,850 B2
(45) Date of Patent: Dec. 20, 2016

(54) HOLDER ASSEMBLY FOR COOPERATING WITH AN ENVIRONMENTAL CELL AND AN ELECTRON MICROSCOPE

(71) Applicants: FEI Company, Hillsboro, OR (US); Delft University of Technology, Delft (NL)

(72) Inventors: Hendrik Willem Zandbergen, Katwijk (NL); Pleun Dona, Veldhoven (NL); Gerardus Nicolaas Anne van Veen, Waalre (NL)

(73) Assignee: FEI COMPANY, Hillsboro, OR (US)

( * ) Notice: Subject to any disclaimer, the term of this patent is extended or adjusted under 35 U.S.C. 154(b) by 662 days.

(21) Appl. No.: 13/769,040

(22) Filed: Feb. 15, 2013

(65) Prior Publication Data

US 2013/0213439 A1 Aug. 22, 2013

Related U.S. Application Data

(60) Provisional application No. 61/600,428, filed on Feb. 17, 2012.

(30) Foreign Application Priority Data

Feb. 27, 2012 (EP) ..................... 12157055

(51) Int. Cl.
*H01J 37/20* (2006.01)
(52) U.S. Cl.
CPC .......... *H01J 37/20* (2013.01); *H01J 2237/022* (2013.01); *H01J 2237/2001* (2013.01);
(Continued)
(58) Field of Classification Search
CPC ................ H01J 37/20; H01J 2237/2001; H01J 2237/2003; H01J 2237/2605; H01J 2237/2802; H01J 2237/022
See application file for complete search history.

(56) References Cited

U.S. PATENT DOCUMENTS

| 5,563,412 A | 10/1996 | Zandbergen et al. |
| 7,541,580 B2 | 6/2009 | Knowles et al. |
| (Continued) | | |

FOREIGN PATENT DOCUMENTS

| GB | 1477458 | 10/1974 |
| JP | 63291346 | 11/1988 |
| WO | WO9707525 | 2/1997 |

OTHER PUBLICATIONS

Creemer, J. Fredrik, et al, 'A MEMS Reactor for Atomic-Scale Microscopy of Nanomaterials Under Industrially Relevant Conditions,' Journal of Microelectromechanical Systems, Apr. 2010, pp. 254-264, vol. 19, No. 2.

(Continued)

*Primary Examiner* — Wyatt Stoffa
*Assistant Examiner* — Sean Luck
(74) *Attorney, Agent, or Firm* — Scheinberg & Associates, P.C.; Michael O. Scheinberg

(57) ABSTRACT

A holder assembly comprises a first and a separable second part, the first part detachable from the second part, the first part comprising a tube and an environmental cell interface and the second part comprising an electron microscope interface, as a result of which the first part can be cleaned at high temperatures without exposing the second part to said high temperature.
By forming the holder assembly from detachable parts, one part can be cleaned by heating it to a high temperature of, for example, 1000° C., clogging in the tubes can be removed by reduction of carbon, while keeping the other part (often comprising mechanical fittings, ball bearing, sliders, or such (Continued)

like) cool. The cleaning can be enhanced by blowing, for example, oxygen or hydrogen through the tubes.

20 Claims, 1 Drawing Sheet

(52) U.S. Cl.
CPC .............. *H01J 2237/2003* (2013.01); *H01J 2237/2605* (2013.01); *H01J 2237/2802* (2013.01)

(56) References Cited

U.S. PATENT DOCUMENTS

| | | | |
|---|---|---|---|
| 7,791,020 B2 | 9/2010 | Uncovsky et al. | |
| 8,093,558 B2 | 1/2012 | Buijsse | |
| 8,153,966 B2 | 4/2012 | Arai et al. | |
| 2007/0063148 A1* | 3/2007 | Miyazaki | H01J 37/20 250/442.11 |
| 2007/0145287 A1* | 6/2007 | Chao | H01J 37/20 250/440.11 |
| 2007/0145288 A1* | 6/2007 | Chao | H01J 37/20 250/440.11 |
| 2007/0145289 A1* | 6/2007 | Chao | H01J 37/20 250/440.11 |
| 2008/0099695 A1* | 5/2008 | Sugizaki | G01N 1/32 250/492.1 |
| 2008/0179518 A1* | 7/2008 | Creemer | H01J 37/20 250/311 |
| 2009/0242763 A1* | 10/2009 | Buijsse | H01J 37/023 250/307 |
| 2010/0102248 A1* | 4/2010 | Milas | H01J 37/20 250/440.11 |
| 2010/0108881 A1 | 5/2010 | Toth et al. | |
| 2011/0031394 A1 | 2/2011 | Knowles et al. | |
| 2011/0097706 A1 | 4/2011 | van Veen et al. | |
| 2011/0180724 A1* | 7/2011 | Terada | H01J 37/185 250/442.11 |
| 2011/0248165 A1* | 10/2011 | Damiano, Jr. | H01J 37/20 250/307 |
| 2012/0091338 A1 | 4/2012 | Buijsse | |
| 2012/0112062 A1 | 5/2012 | Novak et al. | |
| 2013/0040400 A1 | 2/2013 | Konings et al. | |

OTHER PUBLICATIONS

Deshmukh, Pushkarraj Vasant, 'Design and development of an environmental cell for dynamic in situ observation of gas-solid reactions at elevated temperatures,' University of Pittsburgh, 2008, pp. 70-79.

* cited by examiner

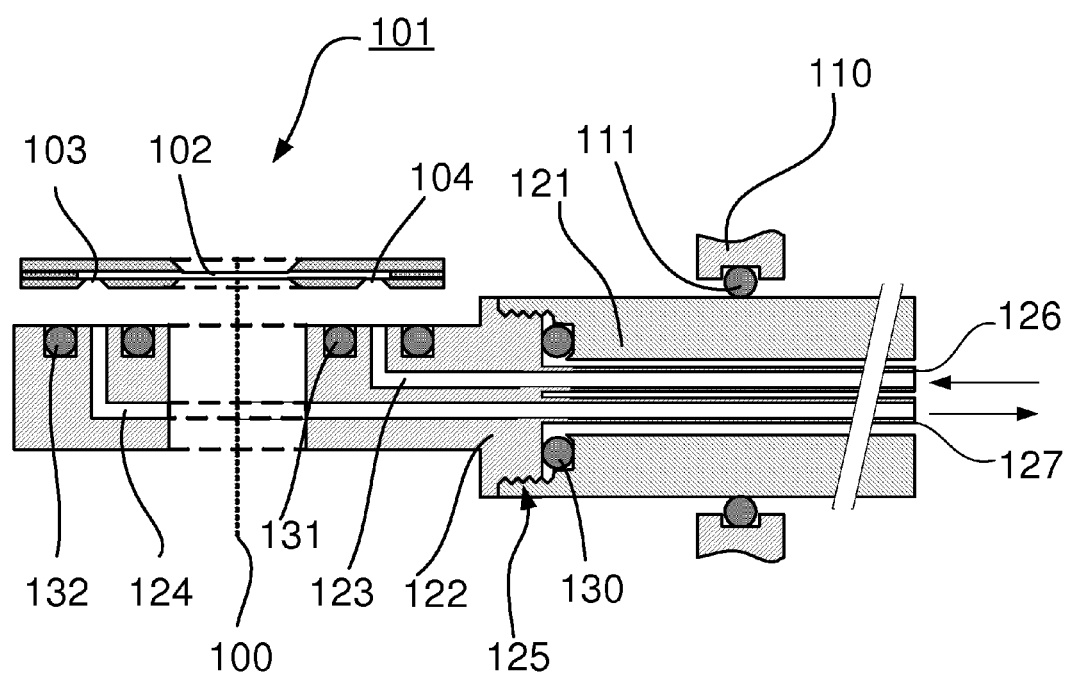

HOLDER ASSEMBLY FOR COOPERATING WITH AN ENVIRONMENTAL CELL AND AN ELECTRON MICROSCOPE

This application claims priority from U.S. Prov. Appl. No. 61/600,428, filed Feb. 17, 2012, where is hereby incorporated by reference.

The invention relates to a holder assembly for cooperating with an environmental cell and an electron microscope, the environmental cell showing a fluid inlet, the electron microscope showing a vacuum wall for separating an evacuable part of the electron microscope from the outside of the electron microscope, the holder assembly comprising an electron microscope interface for forming a sealing interface with the electron microscope, the holder comprising an environmental cell interface for forming a sealing interfacing with the fluid inlet of the environmental cell, and the holder comprising a tube for connecting a fluid supply to the fluid inlet of the environmental cell.

The invention further relates to a method of cleaning such a holder assembly.

Such a holder assembly is known from "MEMS reactor for atomic-scale microscopy of nanomaterials", J. F. Creemer et al., Journal of Microelectromechanical Systems 19 No 2 (April 2010), pp. 254-264, (further referred to as Creemer [1]), more specifically p. 259: D. Specimen Holder.

In an Electron Microscope (EM) a sample is inspected (analyzed, imaged, measured) by irradiating the sample with a beam of electrons, and detecting the radiation emerging from the sample in response to said irradiation. The irradiation can take the form of scanning a focused beam of electrons over the sample, as is done in Scanning Transmission Electron Microscopy (STEM) and Scanning Electron Microscopy (SEM), or it may take the form of irradiating the sample with a parallel beam of electrons, as is done in Transmission Electron Microscopy (TEM). The emerging radiation may comprise, for example, secondary electrons (having an energy of less than 50 eV), backscattered electrons (having an energy of more than 50 eV), transmitted electrons (either scattered or non scattered), light (fluorescence, phosphorescence) and X-rays.

Normally the study of the sample is performed in a high vacuum at a pressure of less than $10^{-4}$ mbar, more specifically less than $10^{-6}$ mbar, as otherwise the impinging electrons are scattered by the gas atoms, resulting in damage to components of the EM and/or deterioration of the achievable resolution.

A disadvantage of high vacuum is its incompatibility with many samples, such as biological samples. Dehydration occurs unless the samples are frozen or embedded in a resin. Freezing must be done in such a manner that amorphous ice is formed, as otherwise ice needles damage the delicate biological structures, such as membranes. For amorphous ice to be stable a temperature below 137 K must be maintained, demanding expensive cryo-electron microscopes. Embedding in resin is a difficult and time consuming process, often introducing artifacts.

Specialized EM's, so-called ETEM's (stemming for Environmental TEM's) are known that can operate at pressures of, for example, 20 mbar. At a temperature of approximately 20° C. the equilibrium pressure of water is 20 mbar, and thus a moist sample can be observed at that pressure and temperature. The price tag for such instruments is however much higher than that of comparable instruments not capable to operate at such a pressure. An example of such an instrument is the Titan ETEM, produced by FEI Company, Hillsboro, USA.

Another area of investigation is the study of chemical reactions. Such reactions can, for example, occur between solids and gas, or between two gases, of a liquid and a gas. An example is the growth of nano-particles (particles with a size less than 1 µm, preferably less than 100 nm), or the change of catalyst material. Such studies should preferably be performed at a high pressure (1 atmosphere or more) and/or at a high temperature (500° C. or more), comparable to the environment in which such catalyst processes normally occur.

An alternative to a dedicated TEM for such experiments is the use of an Environmental Cell (ECELL) used in cooperation with a standard TEM. An ECELL comprises one or two thin foils that are transparent to the electrons used, between which a thin volume is formed. In this volume the sample is placed, either by mechanical insertion of an ECELL that can be opened and closed, or by inserting it (for example in the form of a fluid or dissolved in a fluid) via openings in the ECELL. The pressure and/or temperature in this volume may differ from the pressure and/or temperature in the sample chamber of the electron microscope. It is noted that an ECELL enables experiments at much higher pressures and/or temperatures than possible in an ETEM, and also enable the use of reactive gasses, and even the use of liquids.

Although ECELL technology is still an emerging technology, many variants of ECELLs are known already.

An example of an ECELL that can be opened (to insert a sample therein) is given in the dissertation "Design and development of en environmental cell for dynamic in situ observation of gas-solid reactions at elevated temperatures", P. V. Deshmukh, University of Pittsburgh, 2008, further referred as Deshmukh [2], more specifically in paragraph 4.1 (pages 70-79, most specifically FIG. 46 (page 78). Another ECELL is described in Creemer [1], paragraph II, Design, pp. 255-259. Here a MEMS (micro-electro-mechanical system) cell is shown comprising two chips, each with electron transparent windows, the chips kept at a distance from each other and glued together. One of the chips shows a hole for gas inlet and a hole for gas outlet, which interfaces with a holder. Surrounding each of the holes for the gas inlet and gas outlet a vacuum seal is formed with a miniature sealing body in the form of a miniature O-ring.

It is noted that in this context the phrase ECELL includes the phrase nano-reactors.

It is further noted that in certain cases the sample is not inserted, but is formed in said thin volume of the ECELL, for example as a result of a chemical reaction of two fluids or dissociation of one fluid due to a stimulus such as light, electron beam bombardment, or an elevated temperature.

A disadvantage of the known ECELL's and ECELL holders is that the tubes supplying fluid (in most cases a gas) to the inside of the ECELL are very narrow. It should be understood that the tip of a typical holder for a TEM (the part close to the optical axis of the electron microscope) has a width of 4-5 mm, and that thus capillaries of much less than a millimeter are used. Creemer [-1-] mentions the use of copper capillaries with an inner diameter of 0.22 mm.

It is clear that, in view of the inner diameter of the tube, clogging or contamination often cannot be remedied by mechanical cleaning. Often heating in combination with blowing a gas through the tube is the only solution, in the hope that particles are either evaporated or form a gaseous product. Many of such particles—comprising carbon—must be exposed to a temperature of, for example, 500° C. before they are removed in this way. Use of even higher temperatures, for example in excess of 1000° C. is preferred. Often the upper limit is governed by the material of which the tubes and ECELL interface are made.

A complication is that often the tube of the holder is bonded to the part comprising the ECELL interface with vacuum compatible epoxy resin. Exposure of the epoxy to a temperature that cleans the tube automatically destroys the bonds (as both the contaminant and the epoxy resin comprise carbon).

Alternatively it is known to weld the tube to the ECELL interface, but the costs associated with forming a vacuum tight weld on tubes with an inner diameter of 0.22 mm are extremely high. A related complication is that welding is not possible between all materials, and welding of metal to, for example, a ceramic, is not possible.

A related problem is that exposing the holder to such an elevated temperature may lead to mechanical deformation of the holder, resulting in for example loss of tolerances of the sealing interface of the holder with the electron microscope. This in turn may result in leakage of the holder when inserted in the electron microscope. Also other parts of the holder, for example mechanisms necessary for the positioning of the tip near the electron beam, may not be heated to high temperatures as otherwise loss of function occurs.

Another problem is that preferably a large part of the holder should the conductive to avoid charging. Charging is a problem known to the person skilled in the art. Heating the holder to a high temperature is likely to result in a holder that shows an oxidized, and therefore electrically isolating, surface.

Another, related, problem is that the holder may need cleaning from material left over from earlier experiments and/or resulting from storage.

It is an object of the invention to provide an ECELL holder that can be cleaned without damaging the EM interface and without oxidizing a large part of its surface.

To that end the holder assembly according to the invention is characterized in that the holder assembly comprises a first and a second part, the first part detachable from the second part, the first part comprising the tube and the environmental cell interface and the second part comprising the electron microscope interface, as a result of which the first part can be cleaned at high temperatures without exposing the second part to said high temperature By forming the holder assembly such that the part of the assembly comprising the tubes is detachable from the part comprising the EM interface, the tubes can be cleaned at high temperature without damaging of semi-permanent connections like soldered or glued connection, or damaging tolerances of the EM interface, or oxidizing a large part of the holder.

The tubes must pass through the wall of the microscope (to connect the environmental cell interface with the outside of the microscope), and therefore the second part at least partly surrounds the first part. Typically the second part thus contains a part in the form of a hollow cylinder.

In an embodiment the holder assembly further shows a hermetic seal sealing the first part of the holder assembly on the second part of the assembly, the seal in working sealing the evacuable part of the electron microscope from the outside of the microscope.

Where the two parts meet, a seal should be formed to avoid leakage from the outside of the electron microscope to the evacuable inside of the microscope.

In another embodiment the holder assembly is a holder assembly for cooperating with an environmental cell showing a fluid inlet and a fluid outlet, and the environmental cell interface of the holder assembly further forms a sealing interface to the fluid outlet of the environmental cell, and the holder assembly comprises a tube for transporting fluid from the environmental cell to the outside of the electron microscope.

Although it is possible to work with an environmental cell that connects to an inlet tube while the outlet is either not present or vents to the vacuum of the evacuable area of the microscope, preferably the environmental cell is equipped with an inlet and an outlet, and thus the holder assembly equipped with an inlet tube and an outlet tube The invention enables the use of different materials for the first part (comprising tubes and environmental cell interface) the second part (comprising the electron microscope interface). For many experiments a preferred choice would be ceramics for the first part and metal for the second part. The ceramic tubes are inert and heatable to a high temperature (well in excess of 1000° C.), while the metal parts may comprise parts needed for the mechanical positioning of the assembly with respect to the microscope wall. However, for many experiments also metals (preferable inert, non-magnetic and/or non-oxidizing) such as molybdenum, tantalum, or platinum can be used.

It is noted that the second part may be constructed from several metals that are glued, welded or soldered together, as these parts need not be heated to a high temperature.

In yet another embodiment the holder assembly further comprises one or more electrical connections connecting electrical pins with electrical interconnects at the environmental cell interface, the electrical pins in working accessible from the outside of the electron microscope.

Electrical feed-troughs may be integrated in the second part, so that electrical signals can be transported for the outside to the environmental cell or vice versa. Such signals can be used for heating, determining a temperature, etc.

Also an optical feed-through may be integrated. An optical feed-through is described and used by Deshmukh [-2-].

In yet another embodiment the holder assembly comprises a further interface for interfacing with an analysis or inspection tool other than an electron microscope, or a sample preparation apparatus.

It is noted that primarily the holder assembly is for use with an electron microscope, and therefore it is essential that the holder assembly shows a sealing interface with the electron microscope. If the holder is to be used with other analytical or inspection tools (for example an X-ray analyzer), or a sample preparation tool, an interface specific to that tool may be included as well.

In a preferred embodiment the first part is a ceramic part and the second part is a metal part.

The advantage of a ceramic material is its resistance to high temperatures and/or reactive gases, as a ceramic is typically inert. A disadvantage of a ceramic is that ceramics are often fragile. On the other hand a metal, such as titanium, is very resistant to mechanical forces and well machinable (including welding and soldering). Combining a first part of ceramic and a second part of, for example, titanium, results in an assembly that can be cleaned by heating the first part to a temperature of, for example, 1000° C., while in normal operation the fragile ceramic tubes are protected to the titanium tube surrounding them. This results in a robust design.

In an aspect of the invention a method of cleaning and/or decontaminating a holder assembly, the holder assembly for cooperating with an environmental cell and an electron microscope, the environmental cell showing a fluid inlet, the electron microscope showing a vacuum wall for separating an evacuable part of the electron microscope from the outside of the electron microscope, the holder assembly comprising an electron microscope interface for forming a sealing interface with the electron microscope, the holder assembly comprising an environmental cell interface for forming a sealing interfacing with the environmental cell, and the holder comprising a tube for connecting a fluid supply to the fluid inlet of the environmental cell, is characterized in that the holder assembly comprises a first part and a second part, the first part detachable from the second part, the first part comprising the tube and the environmental cell interface and the second part comprising the electron microscope interface, and the cleaning involves exposing the tube and environmental cell interface to a temperature in excess of 500° C. without exposing the part comprising the electron microscope interface to said high temperature.

Especially when blowing a gas, preferably an oxidizing gas, through the tubes while cleaning and/or decontaminating the first part at a temperature of 500° C., most contaminants are removed. As the second part is kept cool, this may be a rather complex part, comprising for example parts needed for positioning the holder assembly with respect to the TEM. However, cleaning can also be achieved by flushing the tubes with a liquid, more specifically an acidic liquid. This cleaning with a liquid may be used instead of cleaning with a gas, or may follow cleaning with a gas.

The invention is now elucidated using figures, in which identical reference numerals refer to corresponding features.

BRIEF DESCRIPTION OF THE DRAWINGS

To that end:

FIG. 1 schematically shows a holder assembly with an environmental cell and the wall of a TEM.

FIG. 1 schematically shows a holder assembly with an environmental cell and the wall of a TEM.

An environmental cell 101 is a MEMS structure comprising two thin foils enclosing a volume 102 centered round axis 100. In working an electron beam with electrons with a selectable energy of, for example, between 60 and 300 keV travels along axis 100 and enters volume 102 via one of the foils and at least part of the electrons leave the volume via the other foil. The volume is further connected to two openings 103 and 104, one acting as inlet and the other acting as outlet for a fluid. In normal operation the environmental cell 101 is placed against the first part 122 (clamping means not shown) of the holder assembly.

The openings 103 and 104 are in normal operation aligned against two channels 123 and 124 in the first part 122. In the first part two small O-rings 132 and 131 are placed to provide a hermetic seal of the first part of the holder assembly against the environmental cell.

Channel 123 is connected to tube 126 and channel 124 to tube 127. The first part, comprising the environmental cell interface and the tubes, can be made of, for example, a ceramic material, where a hermetic (or almost hermetic seal) between part 122 and the tubes is formed. Joining the parts may be achieved by so-called fritting, in which a ceramic frit is added and fired, thus forming the required hermetic seal.

It is noted that in this way a ceramic ECELL interface can be joined with ceramic tubes, or that one or both parts can be made from glass.

It is further noted that the ECELL need not be a MEMS structure. For example the ECELL used by Deshmukh [-2-] is not an MEMS structure.

It is mentioned that the hermetic sealings 132 and 131 (O-rings) are removable, and are removed during a bake-out or cleaning process.

The first part is mounted on and sealed against a second part 121 ending in a cylinder. The cylinder has a bore in which the tubes are positioned. The bore is connected to atmosphere. The seal between the first part and the second part is formed by an O-ring 130.

Another seal is formed by an O-ring 111 between the outer diameter of the cylinder and the wall 110 of the electron microscope.

It is noted that slight leakage from the tubes or the interface between tubes and the environmental cell interface is allowed as the thus leaked gas leaks into the bore of the cylinder that connects to atmosphere. However, this might result in unwanted effects, such as health hazards, depending on the gases used.

It is further noted that the hermetic seal 130 between first and second part may be located near the atmospheric end of the assembly.

The first part can be cleaned or decontaminated by exposing it to a high temperature, for example in excess of 500° C., preferably in excess of 1000° C. Cleaning can be assisted by blowing for example oxygen or hydrogen through the (heated) tubes, so that the contamination (often comprising carbon) is turned in gaseous products.

It is noted that the maximum temperature depends on the materials used, and that, for example a temperature of more than 1500° C. should be avoided when using ceramic materials, as these become ductile at such elevated temperatures.

It is further noted that the cleaning may be done in a vacuum, so that the surface areas (that may be metalized so as to form a conductive layer) are not oxidized.

The second part, often comprising mechanical fittings, ball bearing, sliders, or such like, can be kept cool, thereby retaining tolerance and keeping, for example greasing etc.

Another form of cleaning involves dissolving the contamination by flushing with an acid. Here as well glass or ceramics are good choices for the first part (to be cleaned), while a metal second part, comprising mechanical fittings, rulers, ball bearings, axles, is used. Here as well to quite different materials are used, and therefore detachable first and second parts are preferred.

LITERATURE

[1] MEMS reactor for atomic-scale microscopy of nanomaterials, J. F. Creemer et al., Journal of Microelectromechanical Systems 19 No 2 (April 2010), pp. 254-264,

[2] Design and development of an environmental cell for dynamic in situ observation of gas-solid reactions at elevated temperatures, P. V. Deshmukh, thesis, University of Pittsburgh, 2008.

We claim as follows:

1. A holder assembly for cooperating with an environmental cell and an electron microscope, the environmental cell having a fluid inlet, the electron microscope having a vacuum wall for separating an evacuable part of the electron microscope from the outside of the electron microscope, the holder assembly comprising:

an electron microscope interface for forming a sealing interface with the electron microscope, an environmental cell interface for forming a sealing interface with the fluid inlet of the environmental cell, and a tube for connecting a fluid supply to the fluid inlet of the environmental cell, the holder assembly including a first and a second part, the first part detachable from the second part, the first part comprising the tube and the environmental cell interface and the second part comprising the electron microscope interface and an interior passage connected to atmosphere for the tube to extend from the first part to outside the electron microscope, as a result of which the first part can be detached and cleaned at high temperatures without exposing the second part to said high temperature.

2. The holder assembly of claim 1 in which the holder assembly further includes a hermetic seal sealing the first part of the holder assembly on the second part of the assembly, the seal in working sealing the evacuable part of the electron microscope from the outside of the microscope.

3. The holder assembly of claim 1 in which the holder assembly is a holder assembly for cooperating with an environmental cell showing a fluid inlet and a fluid outlet, and the environmental cell interface of the holder assembly further forms a sealing interface to the fluid outlet of the environmental cell, and the holder assembly comprises a second tube for transporting fluid from the environmental cell to the outside of the electron microscope.

4. The holder assembly of claim 1 in which the holder assembly further comprises one or more electrical connections connecting electrical pins with electrical interconnects at the environmental cell interface, the electrical pins accessible from the outside of the electron microscope.

5. The holder assembly of claim 1 in which the holder assembly shows an optical path connecting an optical coupling to an optical interconnection at the environmental cell, the optical coupling located at or accessible from the outside of the electron microscope.

6. The holder assembly of claim 1 in which the holder assembly comprises a further interface for interfacing with an analysis tool other than the electron microscope or a sample preparation apparatus.

7. The holder assembly of claim 1 in which the tubes and/or the environmental cell interface are made of a ceramic material, titanium, tantalum, or platinum.

8. The holder assembly of claim 7 in which the second part comprises metal or is metalized.

9. Method of cleaning and/or decontaminating a holder assembly, the holder assembly for cooperating with an environmental cell and an electron microscope, the environmental cell having a fluid inlet, the electron microscope having a vacuum wall for separating an evacuable part of the electron microscope from the outside of the electron microscope, the holder assembly comprising an electron microscope interface for forming a sealing interface with the electron microscope, the holder assembly comprising an environmental cell interface for forming a sealing interfacing with the environmental cell, and the holder assembly comprising a tube for connecting a fluid supply to the fluid inlet of the environmental cell, the tube extending from the part of the holder assembly that includes environmental cell interface through an interior passage in the part of the holder assembly that includes the electron microscope interface to outside the electron microscope, the interior passage being connected to atmosphere outside the electron microscope and the environmental cell interface being detachable from the part of the holder assembly comprising the electron microscope interface, the method comprising:

separating the part of the holder assembly that includes the electron microscope interface from the part of the holder assembly that includes the environmental cell interface; and removing contaminants from the part of the holder assembly that includes the environmental cell interface.

10. The method of claim 9 in which the tube and/or the environmental cell interface are made of a ceramic material, titanium, tantalum, or platinum.

11. The method of claim 9 or claim 10 in which the removing of the contaminants involves changing the contaminants to volatile products by exposing the tubes and environmental cell interface to a temperature in excess of 500° C.

12. The method of claim 11 further involving blowing a gas through the tubes.

13. The method of claim 12 in which the gas is a gas from the group of oxygen and hydrogen.

14. The method of claim 9 in which the cleaning involves flushing the tubes with a liquid.

15. The method of claim 14 in which the liquid flushing the tubes comprises an acidic liquid.

16. The method of claim 9 in which removing contaminants comprises changing the contaminants to volatile products by exposing the tubes and environmental cell interface to a temperature in excess of 1000° C.

17. The method of claim 9 in which the method is performed in a vacuum.

18. A holder assembly for holding an environmental cell within an electron microscope having a vacuum wall defining a vacuum chamber of the electron microscope, the environmental cell having a fluid inlet, the holder assembly comprising:

a first part including:
an electron microscope interface for forming a sealing with the electron microscope vacuum wall; and
an interior passage; and
a second part adapted to support the environmental cell, being detachable from the first part, and including:
an environmental cell interface for forming a sealed connection with the fluid inlet of the environmental cell, and
a tube configured to supply fluid to the environmental cell fluid inlet through the environmental cell interface from a fluid supply outside of the vacuum chamber, the tube extending through the interior passage of the first part, the interior passage connected to atmosphere;
wherein the first part can be detached and cleaned at high temperatures without exposing the second part to said high temperature.

19. The holder assembly of claim 18 in which the environmental cell as a fluid outlet and in which the second part further comprises a second tube configured to receive fluid from the environmental cell fluid outlet through the environmental cell interface, the second tube extending through the interior passage of the first part.

20. An environmental cell and holder cell assembly, comprising:
a holder assembly in accordance with claim 18; and
an environmental cell attached to environmental cell interface.

* * * * *